United States Patent
Harrigan et al.

[11] Patent Number: 6,098,264
[45] Date of Patent: Aug. 8, 2000

[54] METHOD OF ASSEMBLING LASER AND MODULATOR UNIT

[75] Inventors: Michael E. Harrigan, Webster; Douglass L. Blanding, Rochester; Bradley S. Jadrich, Rochester; Badhri Narayan, Rochester, all of N.Y.

[73] Assignee: Eastman Kodak Company, Rochester, N.Y.

[21] Appl. No.: 09/251,786

[22] Filed: Feb. 17, 1999

[51] Int. Cl.[7] .................................................. B23Q 3/00
[52] U.S. Cl. ........................ 29/464; 29/407.09; 29/407.1
[58] Field of Search .............................. 29/407.09, 407.1, 29/466, 468, 469, 464; 359/813

[56] References Cited

U.S. PATENT DOCUMENTS

| | | | |
|---|---|---|---|
| 3,357,091 | 12/1967 | Reissmueller et al. | 29/470 |
| 3,551,057 | 12/1970 | Hamilton et al. | 356/172 |
| 3,847,703 | 11/1974 | Kaiser | 156/294 |
| 3,907,436 | 9/1975 | Wolga | 356/153 |
| 4,117,319 | 9/1978 | White, III | 250/201 |
| 4,498,737 | 2/1985 | Doggett | 350/237 |
| 5,011,282 | 4/1991 | Ream et al. | 356/153 |
| 5,020,074 | 5/1991 | Lerfald | 372/107 |
| 5,039,998 | 8/1991 | Seto | 346/108 |
| 5,041,716 | 8/1991 | Wakabayashi | 219/121.68 |
| 5,077,622 | 12/1991 | Lynch et al. | 359/813 |
| 5,140,653 | 8/1992 | Taneya | 385/4 |
| 5,181,304 | 1/1993 | Piotrowski | 29/271 |
| 5,208,888 | 5/1993 | Steinblatt et al. | 385/90 |
| 5,237,348 | 8/1993 | Blanding et al. | 346/160 |
| 5,294,943 | 3/1994 | Blanding et al. | 346/108 |
| 5,322,463 | 6/1994 | Young | 445/4 |
| 5,351,330 | 9/1994 | Jongewaard | 385/93 |
| 5,521,999 | 5/1996 | Chuang et al. | 385/88 |
| 5,550,669 | 8/1996 | Patel | 359/224 |
| 5,666,447 | 9/1997 | Chuang et al. | |
| 5,668,899 | 9/1997 | Jadrich | |
| 5,717,666 | 2/1998 | Park | 369/44.11 |
| 5,859,947 | 1/1999 | Kiryuscheva et al. | 385/136 |
| 5,946,023 | 8/1999 | Blanding | 347/257 |

OTHER PUBLICATIONS

R.R. Firth, D. Kessler, E. Muka, M. Naor and J.C. Owens; A Continuous–Tone Laser Color Printer; Journal of Imaging Technology, vol. 14, No. 3, Jun. 1988, pp. 78–89.

*Primary Examiner*—David P. Bryant
*Assistant Examiner*—Essama Omgba
*Attorney, Agent, or Firm*—David A. Novais; Nelson Adrian Blish

[57] ABSTRACT

A replaceable modular opto-mechanical unit includes a light source in the form of, for example, a laser assembly; an optical modulator assembly which modulates light from the light source; and a lens located in a light path between the light source and the optical modulator assembly. The lens focuses the light from said light source toward a center of the optical modulator assembly. The unit further includes a base adapted to removably support the light source, the optical modulator assembly and the lens in an optically aligned manner. The base is further adapted to be removably attached onto a receiving structure of a printer, such that an attachment of the base having the optically aligned light source, optical modulator assembly, and lens supported thereon, permits light from the optical modulator assembly to be focussed onto an optical element of the printer.

11 Claims, 12 Drawing Sheets

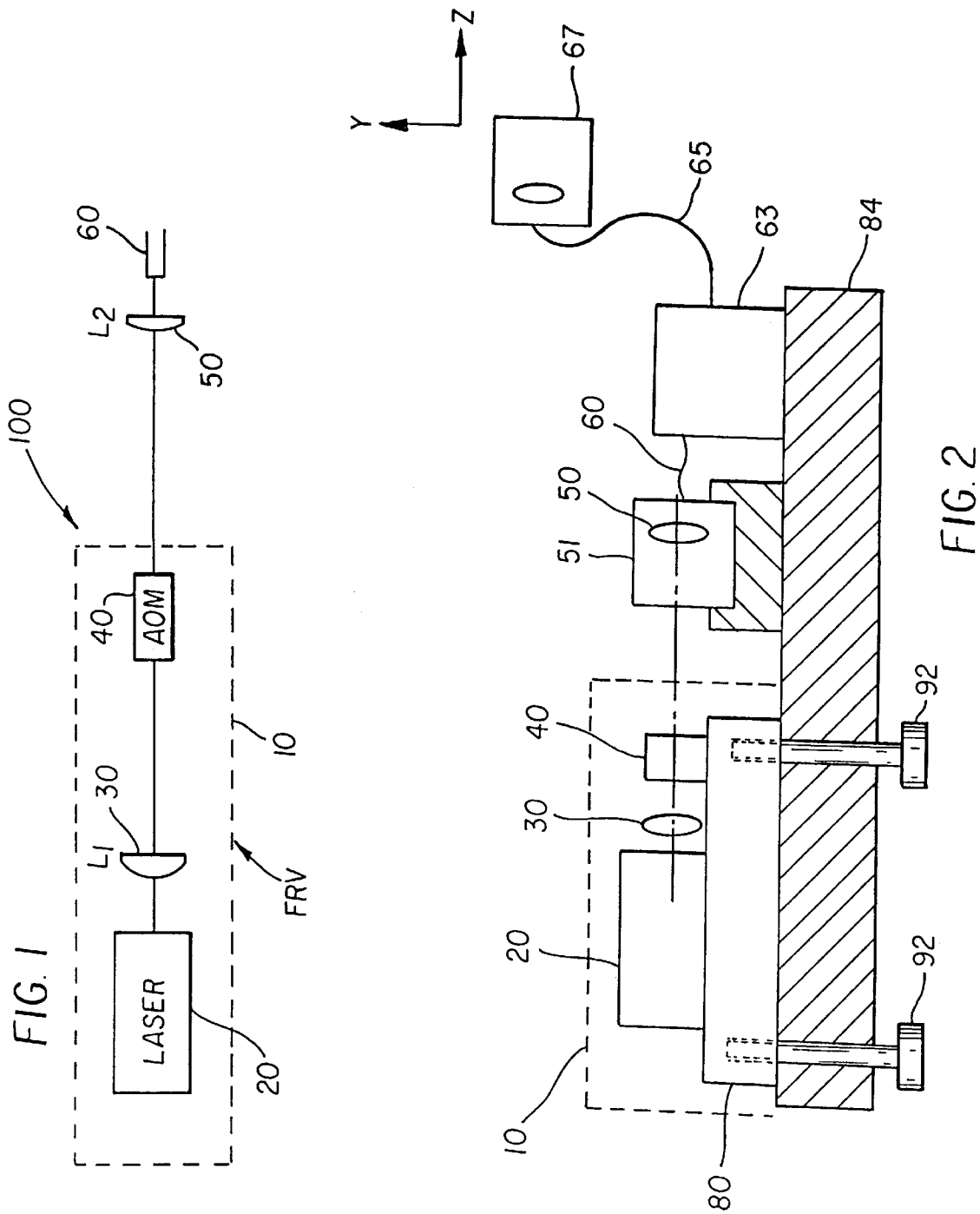

METHOD OF ASSEMBLING LASER AND MODULATOR UNIT

CROSS REFERENCE TO RELATED APPLICATIONS

The present application is related to co-pending U.S. patent application Ser. No. 09/078,333 filed May 12, 1998, by Douglass L. Blanding, entitled PRECISION ASSEMBLY TECHNIQUE.

FIELD OF THE INVENTION

This invention relates to laser printers for full color images on visible photosensitive media such as silver halide, and a means to replace, without adjustment, the laser and acousto-optical modulator as a unit.

BACKGROUND OF THE INVENTION

In digital laser printers, it is common to employ lasers to write on photosensitive media such as silver halide film or laser thermal dye media. The laser emits a beam which must be modulated by some means in order to write each line of a raster image. It is common practice to use an acousto-optic modulator (hereinafter referred to as an AOM) for this purpose. An AOM might typically be positioned in the path of a laser beam which has been focussed by a lens. In a polychromatic laser printer, an AOM is required for each wavelength in order to independently modulate each color. In one method of laser printing, the multiple wavelength-beams are combined together into a "white" beam which is then shaped for scanning with a spinning polygon through a focussing lens onto the photosensitive medium. One method for combining the multiple wavelengths is a fiber optic multiplexer as described in U.S. Pat. No. 5,666,447. The input to the fiber optic multiplexer is a single mode optical fiber for each color. In order to couple most of the optical power into such a fiber, it is necessary to focus the beam to a very small spot, typically 0.004 mm in diameter. This spot must be positioned with less than 0.001 mm and accurately aligned in its propagation direction.

In such a configuration, the relative positions of the laser, its focussing lens, the AOM, the fiber coupling lens and the end of the glass fiber must all be very precisely adjusted. The alignment of all these components is very critical, and must be very carefully maintained if the maximum amount of the laser's power is to be injected into the fiber. This alignment is preferably done in the factory under laboratory conditions. There is a considerable amount of apparatus that is used to make the small precise adjustments and also to detect the position and power of the laser beam as it travels through the system. It would be quite inconvenient, if not difficult to set these alignments in the field.

In the event of the failure of a laser (in the field), a new laser would need to be installed in place of the failed one. But the dimensions and optical characteristics of the lasers are not accurate enough to allow the new laser to be installed without adjustment. Thus a failed laser implies the need for an optical realignment of the replacement laser, its lens, and the AOM relative to the fiber coupler. As previously explained, this presents a difficulty, as field adjustment of these critical components is not practical.

Laser printer products for photosensitive media in a visible wavelength range such as disclosed in Firth et al, "A Continuous Tone Laser Color Printer" Journal of Imaging Technology 14:78–89 (1988) have been known for years. Until recently, the laser choices for exposing such media in the green and blue wavelengths has been restricted due to power, wavelengths available, and stability. Argon lasers have often been used, but these lasers are noisy, large and require bulky air cooling with limited lifetimes. Now blue and green solid state lasers are available in much more compact packages without the need for air cooling. Because these lasers are new, their reliability and lifetime are not as high as desired.

Optical systems are normally aligned to the laser beam one component at a time starting near the laser. Each component is then securely positioned. Most systems have very tight tolerances on beam position so that they cannot tolerate even small laser beam position and pointing changes. Lasers have too much variability in their beam sizes, beam positions and angular pointing with respect to the external laser package to allow a simple swapping of lasers. This means that a laser failure, as noted above, is a major problem requiring a replacement of the whole laser printer product due to the impracticability of replacing and aligning such a complex optical system to a new laser outside the factory.

In a color laser printer using three lasers in the primary color wavelengths, an AOM is required for each laser to independently modulate the exposure of each color in order to obtain full color images with a wide gamut. Over a long time period of use, however, the AOM can deteriorate and fail to provide a sufficiently high modulation level and transmission of optical power. AOMs have variability in performance due in part to internal crystal positional and angular tolerances with respect to their packages. In building the optical system for a laser printer, AOMs are placed near the beginning of the train and subsequent components are carefully aligned to the laser beam diffracted by the acoustic wave in the crystal. An AOM failure is thus also a major problem and is impractical to replace in a product outside the factory.

In order to minimize maintenance costs of a laser printer product over several years it is therefore highly desirable to have a laser printer in which the laser and AOM can be replaced by a service person without having to perform extensive alignment of the optical system outside the factory.

SUMMARY OF THE INVENTION

An object of the present invention is to provide for a field replaceable laser assembly and AOM assembly and a method of replacing a the laser assembly and AOM assembly as a unit. The present invention provides for an opto-mechanical unit comprising a laser assembly, a lens and an AOM assembly which make up a unit which is field replaceable. The replaceable units all look alike in that they produce laser beams diverging from the AOM assembly which are substantially the same in their position, angular pointing, size and divergence. The laser printer containing the remaining parts of the optical system has a receiving area in which the replaceable unit is placed and held tightly. In the factory, the optical system is aligned to a standard replaceable unit. The replaceable units are designed and built to produce laser beams alike within certain tolerances. The allowable differences in the exiting beams of the replaceable units are determined by optical power losses tolerable by the laser printer system.

In the present invention, the laser assembly, its focussing lens, and the AOM assembly of the replaceable unit can be rigidly attached to a mount or base. The base can contain a set of interface features which, when engaged with a set of mating features in the printer, insures that the position of the replaceable unit and its components will be precisely located relative to the fiber coupler or other optical element on the printer. In particular, it is important to have the exit beam from the AOM assembly well defined in position and angle with respect to the replaceable unit so that each replaceable unit is substantially the same.

The laser assembly, its lens and the AOM assembly of the replaceable unit can be accurately pre-aligned in the factory to be in their correct positions relative to each other and relative to the interface features on the base. Once these components have been aligned in the factory, they are fixed in place using flexures, glue, etc. This fixes the components in their correct aligned positions.

Field replacement of the replaceable unit requires no adjustment. Also, the interface features of the replaceable unit make contact with corresponding features in the printer, causing the exit laser beam to be precisely and accurately located relative to the fiber optic coupler.

The present invention relates to a method of assembling a replaceable light source and modulator unit which comprises the steps of mounting a light source on a base so as to be movable with respect to the base; mounting a lens adjacent to the light source so as to be movable with respect to the light source; adjusting the lens in at least a transverse position with respect to a light beam from the light source so that the light beam is visually centered at a visual target position; placing a beam profiler in an optical path downstream of the lens to obtain a light beam waist position; and adjusting the light source in a direction of the light beam to obtain the beam waist at the beam profiler.

The present invention also relates to an opto-mechanical assembly method which comprises the steps of mounting a light source on a base; mounting a modulator assembly on the base; placing the base on an alignment fixture which comprises an alignment target location for a light beam from the modulator assembly; and adjusting a position of the light source and the modulator assembly so that the light beam is aligned with the alignment target location.

The present invention also relates to an alignment assembly which comprises a first alignment fixture having a first area for receiving an opto-mechanical modular unit and a second area which comprises an alignment target location for a light beam from the modular unit; and a second alignment fixture comprising adjusters for adjusting a position of individual components of the opto-mechanical unit so as to align a light beam from the opto-mechanical unit with the alignment target location.

BRIEF DESCRIPTION OF THE DRAWINGS

FIG. 1 is a schematic view of an optical system including a replaceable unit in accordance with the present invention;

FIG. 2 is a schematic view of the replaceable unit including a base which is mounted on a receiving structure of a printer;

DETAILED DESCRIPTION OF THE INVENTION

Figure 3:
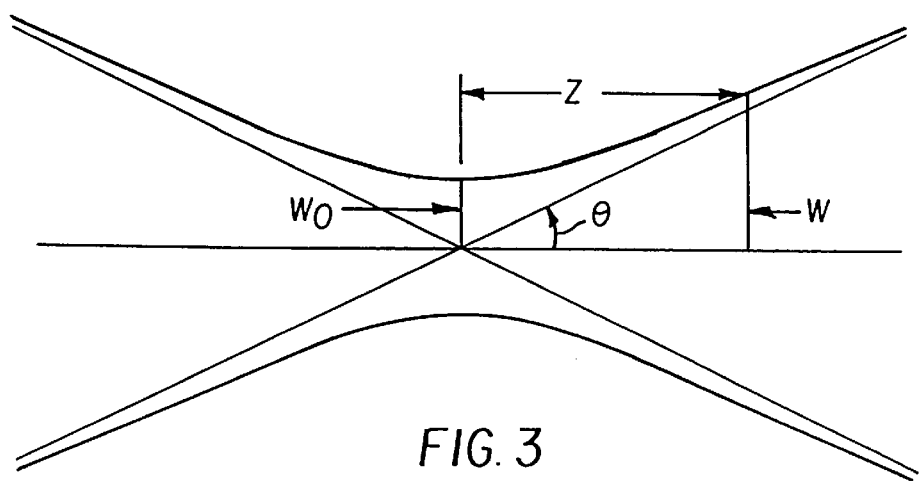
FIG. 3 illustrates a beam waist.

Referring now to the drawings, wherein like reference numerals represent identical or corresponding parts throughout the several views, a schematic of an optical system 100 in accordance with the present invention which includes a modular field replaceable unit 10 is shown in FIG. 1. Replaceable unit 10 comprises a light source in the form of a laser assembly 20, a first lens ($L_1$) 30, and an acoustic-optical modulator assembly 40 (hereinafter referred to as AOM assembly 40). Optical system 100 further includes a second lens ($L_2$) 50 and a single mode fiber 60. Single mode fiber 60 is one of three input fibers of a fiber multiplexer such as disclosed in, for example, U.S. Pat. No. 5,666,447. Referring to FIG. 2, fiber 60 forms an input fiber for a multiplexer 63 which is provided for each wavelength. An output fiber 65 from multiplexer 63 provides a beam in which all three colors are combined in a co-linear fashion for the laser printer which provides an input to a triplet lens assembly 67.

The characteristics of green and blue laser beams as they pass through the parts of optical system 100 provide good motivation for making laser assembly 20, first lens ($L_1$) 30, and AOM assembly 40 all part of replaceable unit 10. The green and blue laser beams as they exit laser assembly 20 are about 0.6 mm $e^{-2}$ diameter. This is relatively large and means that the beam divergence is small. For a pure single mode $TEM_{00}$ Gaussian laser beam, the product of the beam radius and divergence is given by:

$$\omega_0 \theta = \frac{\lambda}{\pi} \tag{1}$$

In this equation, $\omega_0$ is the $e^{-2}$ beam radius and $\theta$ is the angle to the $e^{-2}$ beam intensity as measured from the beam waist. These are shown in FIG. 3. It turns out that the product given in equation 1 is constant at any position in the optical system because it is the Lagrange invariant. For a wavelength of 532 nanometers, equation 1 gives a divergence, $\theta$, of 0.032 degrees. Also, the intensity profile of a pure $TEM_{00}$ single mode laser is given by:

$$I(r) = I_0 e^{-2\left(\frac{r}{\omega}\right)^2} \tag{2}$$

Equation 2 gives the intensity of light at a distance r from the beam peak intensity $I_0$. The distance from the beam peak intensity at which the intensity drops to $e^{-2}$ of the peak intensity is $\omega$. As the beam propagates in free space, it spreads and the value of $\omega$ changes according to:

$$\omega(z) = \omega_0 \sqrt{1 + \left(\frac{z}{z_r}\right)^2} \quad (3)$$

In equation 3, z is the distance along which the beam has propagated, $\omega_0$ is the value of $\omega$ at z=0. The symbol $Z_r$ is called the Rayleigh distance and is given by:

$$z_r = \pi \frac{\omega_0^2}{\lambda} \quad (4)$$

The wavelength of light is $\lambda$.

From these equations it can be seen that the beam at the laser will be relatively sensitive to angular pointing errors and relatively insensitive to displacement. This is because $\omega$ is a measure of the beam lateral displacement sensitivity and $\theta$ is a measure of the angular sensitivity. If the laser is displaced by 0.1 mm, the intensity is still above 80% of the peak intensity and in optical sensitivity numbers, 0.1 mm is not very sensitive. For an angular error in $\theta$ of 0.01 degrees of beam pointing, the intensity will drop to about 82% of the peak intensity. The invariant shows that there can also be positions were the beam will be more sensitive to lateral displacement and less sensitive to angular pointing errors, but the product of these sensitivities will be constant.

The purpose of lens ($L_1$) 30 is to form a beam waist in the center of AOM assembly 40 of about 0.08 millimeters diameter at the $e^{-2}$ position. This is an optimum size for rise time and diffraction efficiency of AOM assembly 40. The invariant then gives an angular divergence of 0.24 degrees, meaning that the angular sensitivity of the beam near AOM assembly 40 is more insensitive to angular pointing errors.

The purpose of second lens ($L_2$) 50 is to image the 0.08 mm waist at AOM assembly 40 at the face of single mode fiber 60 in such a way as to maximize the optical power coupled into fiber 60. It turns out that the optical power coupled into fiber 60 is maximum when the waist of the beam is at the fiber face, the beam center line is aligned with the center axis of fiber 60, and the beam waist diameter matches the fundamental mode diameter of fiber 60. A fiber optic coupler is disclosed in U.S. Pat. No. 5,668,899. The fundamental mode diameter of the fiber is very well approximated by a Gaussian beam profile. In order for fiber 60 to be single mode, its diameter should be very small and for a 532 nanometer wavelength, a fiber should have about a 0.004 mm fundamental mode diameter. Applying the invariant equation to the beam at the fiber face shows that a lateral shift of 0.0005 mm will produce power losses of about 10%. The beam is very divergent there, about 4.8 degrees, much larger than the beam at AOM assembly 40 or laser assembly 20. In this case, the beam at fiber 60 will be very sensitive to lateral displacement errors and much less sensitive to angular pointing errors.

In view of these beam sensitivity issues, it is best to make a break in optical system 100 where neither the lateral displacement or angular pointing sensitivities are extreme such as at laser assembly 20 or at fiber 60. In order to minimize sensitivities and improve the chances of success, it is best to break optical system 100 in the AOM assembly 40 space either before or after AOM assembly 40. In the case here where it is desired to have replaceable lasers and AOMs, it is preferable to make laser assembly 20, first lens ($L_1$) 30, and AOM assembly 40 into modular replaceable unit 10 as shown in FIG. 2.

As also illustrated in FIG. 2, modular replaceable unit 10 further includes a base or mount 80 onto which laser assembly 20, first lens 30 and AOM 30 assembly 40 is mounted. As discussed above, replaceable unit 10 along with second lens 50 and fiber 60 make up part of an optical system. A feature of the present invention is that replaceable unit 10 is removable so as to be replaced by a new replaceable unit 10 upon the breakdown of the original replaceable unit 10. It is a further feature of the invention that replaceable unit 10 is manufactured such that beams are diffracted from AOM assembly 40 in a substantially similar fashion, so that replaceable units 10 can be changed without adjustment and therefore, minimal loss of optical power to fiber 60. As further illustrated in FIG. 2, replaceable unit 10 is mounted directly onto a receiving structure of a printer such as a printer or laser and optics casting 84 in a removable fashion. In the embodiment illustrated in FIG. 2, replaceable unit 10 is mounted onto laser and optics casting 84 by way of screws 92. However, it is noted that the invention is not limited thereto and any means of mounting replaceable unit 10 onto laser and optics casting 84 in a removable manner, such as through the use of adhesives etc. can be utilized.

As discussed above, replaceable units 10 of the present invention are produced so as to have their beams diffracted from AOM assembly 40 in a substantially similar fashion, so that when replaceable units 10 are changed without adjustments, there is a minimum loss of optical power coupled into fiber 60. There are three effects which can reduce the optical power coupled into fiber 60. First, if the focussed waist at fiber 60 does not match the fundamental fiber mode diameter, optical power will be lost. Second, if the waist focal position is shifted from the front of the fiber face, an optical power loss will result. Third, if the beam enters fiber 60 at an angle with respect to the fiber core optical axis, an optical power loss will result. Perturbations in replaceable unit 10 may cause varying combinations of these three effects. These variables will be examined one at a time and the methods of dealing with them will be disclosed.

Starting at laser assembly 20, the beam exiting laser assembly 20 will have variations in its diameter, its waist focal position with respect to the laser front, the beam center lateral position with respect to the external laser package, and beam angular pointing variations. It turns out that the beam diameters for the green and blue lasers being used are caused largely by the laser waist focal position variation. The beam lateral position variation requires that first lens 30 be mounted in such a way that its center could be shifted and then locked in position. The variability of the waist focal position is overcome by mounting lens on a bracket or mount moveable in the Z direction of the optical axis and then locked in position. The angular pointing errors were compensated in combination with AOM pointing as will be explained later.

The red lasers were laser diodes and were much more highly divergent. First lens 30 for the red laser was of a stronger power to collect the more highly divergent light and forming the desired waist size in AOM assembly 40. It also has lateral position adjustments and focal Z adjustments. The focal adjustments are of two types, moving lens 30 with respect to the laser diode, and then sliding the laser assembly and lens as a unit to position the waist in AOM assembly 40. The motion of the laser diode with respect to laser assembly 20 affects both the waist size and position while the overall motion of laser assembly 20 and first lens 30 moves the waist to AOM assembly 40 position.

AOM assembly 40 has variability of small crystal X, Y, and Z positions with respect to its external package as well as all three angular errors. In addition, it was found that the AOM pointing varies when the RF voltage is changed.

Figure 4:
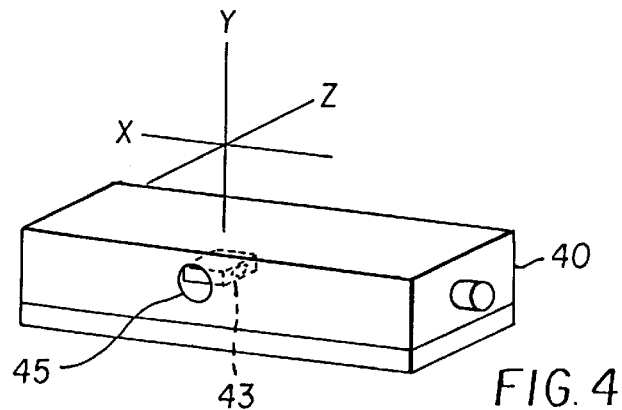
FIG. 4 shows an AOM in accordance with the present invention.

FIG. 4 shows a schematic of AOM assembly 40 with coordinate orientation. A crystal 43 is shown as the small rectangular shape in the center of the figure. The focussed laser beam enters through entrance port 45 as shown.

The 0.08 mm beam depth in AOM assembly 40 is several mm, and large enough so that the beam waist could be mechanically located within the crystal center. The acoustic wave X position with respect to the incoming laser is insensitive and mechanical tolerances were good enough to set this position. Because the acoustic column location with respect to the laser affects the diffraction efficiency of AOM assembly 40, it must be adjusted for each AOM assembly and then fixed in position with respect to the incoming laser. It is important to maintain the diffraction efficiency at a high value to ensure sufficient optical power into the laser printer.

Figure 5:
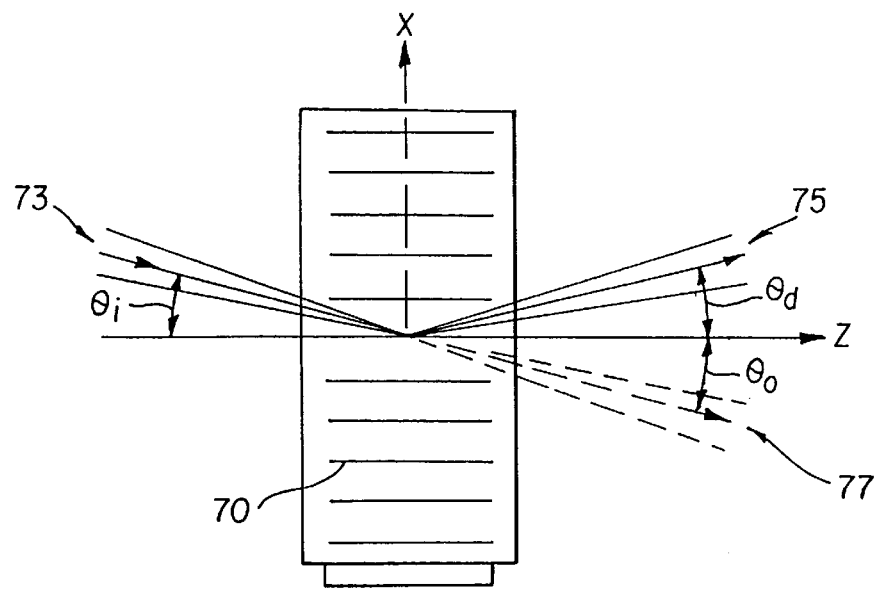
FIG. 5 schematically illustrates diffracted beam profiles.

The angular orientation of crystal 43 with respect to the laser beam axis affects the angular position of the diffracted beam out of AOM assembly 40 and the power in the diffracted order of interest. FIG. 5 is a schematic view of the geometry of an AOM acoustic wave 70, an incident beam 73, a diffracted beam 75, and a zero order beam 77. Diffracted beam 75 is the one modulated by the amplitude of acoustic wave 70 controlled by a piezo-electric transducer. The frequency of the sound wave determines the diffraction angles. To obtain the maximum optical power in diffracted beam 75, AOM crystal 43 containing the acoustic wave must be oriented to satisfy a Bragg condition in which:

$$\theta_i = \theta_B$$
$$\theta_d = \theta_B$$
$$\theta_0 = \theta_B$$
$$\sin\theta_B = \frac{\lambda}{2\Lambda}$$

(wherein $\theta_B$ represents the Bragg angle)

The acoustic wave has wavelength $\Lambda$ and the light beam has wavelength $\lambda$. All angles in FIG. 5 are positive as shown. It should also be noted that the wave vector of the diffracted beam lies in the same plane (plane of incidence) as the incident beam wave vector and the acoustic wave vector. The acoustic wave vector is along plus X in FIG. 5 and is perpendicular to the approximately plane acoustic wavefronts. The acoustic wave in the crystal acts as a mirror reflecting the incident beam off the acoustic wavefronts. The acoustic wavelength is determined by the AOM transducer frequency and the characteristics of the crystal.

The optical power in the diffracted beam 75 falls off sharply when crystal 43 is rotated away from the Bragg condition about the Y axis (out of the plane of the page). Also, if the wave vector of the acoustic wave is not along the external X axis, the diffracted beam will have a component along the external Y axis. This kind of error is an angular rotation about the Z axis. The AOM performance is not very sensitive to rotations about the X axis. It is also important to located the incident beam focus in the center of the acoustic wave. The dimensions of the acoustic wave are approximately 0.25 mm in Y height, 2.5 mm in X length, and 3 mm in Z length. The Y height of the acoustic column can vary by ±0.38 mm and since this is larger than the height of the acoustic column itself, it is very important to position AOM assembly 40 in the Y direction for obtaining good optical power in the diffracted beam.

In order to have a successful replaceable unit 10, it is essential to adjust the Y-axis AOM rotation for Bragg angle and to adjust the Y position. An angular rotation error of crystal 43 about the Z-axis will need to be compensated, but it is not necessary to have a separate adjustment for AOM assembly 40. There are many problems this invention has to overcome in order to position and orient the diffracted beam out of AOM assembly 40 accurately with respect to the external features of replaceable unit 10, and each of these will be discussed in detail.

The laser printer product is designed to accept a laser beam at a substantially fixed height centered on second lens 50 (FIG. 2) with a small angular error with respect to the optical axis of lens 50. As shown in FIG. 2, lens 50 and input fiber 60 of multiplexer 63 can be mounted within a fiber-optic coupler assembly 51. Fiber-optic coupler assembly 51 has adjustments on the fiber lateral positions, angular errors, and focus. These adjustments are made to achieve high optical power coupled into multiplexer 63. Because tolerances on the location of the waist formed by lens 50 with respect to the fiber core center are sub-micron, these adjustments are made for each color laser of each product. Since lens 50 images the waist in AOM assembly 40 on the face of the fiber core, the rays of light diverging from the AOM center pass through the center of the fiber core face after alignment of the fiber to the lens 50 output waist. This further reduces the sensitivity to angular errors of the AOM exit beam. The magnification between the AOM waist and fiber core waist is approximately 20× so the waist diameter of 0.08 mm at the AOM is approximately 0.004 mm at the fiber entrance face. What this means is that the lateral displacement error of the beam at the AOM assembly 40 is about 20 times smaller than that at the fiber entrance face.

By knowing the sensitivity of the optical power coupled into the fiber for lateral displacement, angular and focus errors of the lens 50 waist, it is possible to know the sensitivity of the lateral displacement, angular and focus errors of the beam into lens 50. In this way it is possible to set tolerances on the beam location and pointing diffracted out of AOM assembly 40 and into lens 50. The focal error sensitivities of the waist at AOM assembly 40 are determined primarily by the requirement to have the waist in the center of the acoustic column because focal errors are proportional to the magnification squared. For instance, a 0.01 mm focal error at the fiber input face would be $20^2$ or 400 times 0.01 mm, or 4 mm, an easy value to maintain.

Figure 6:
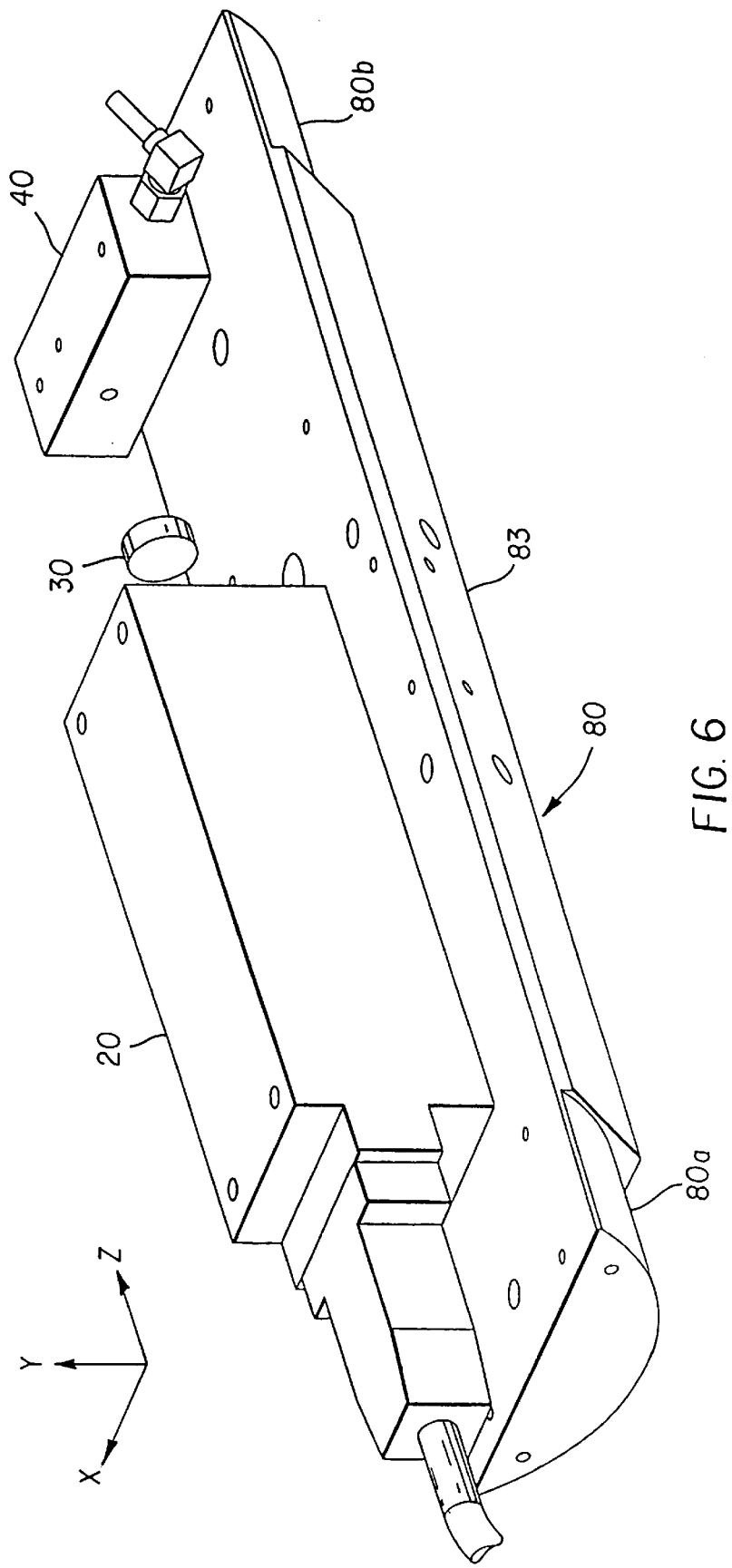
FIG. 6 shows components of the replaceable unit.
Figure 7:
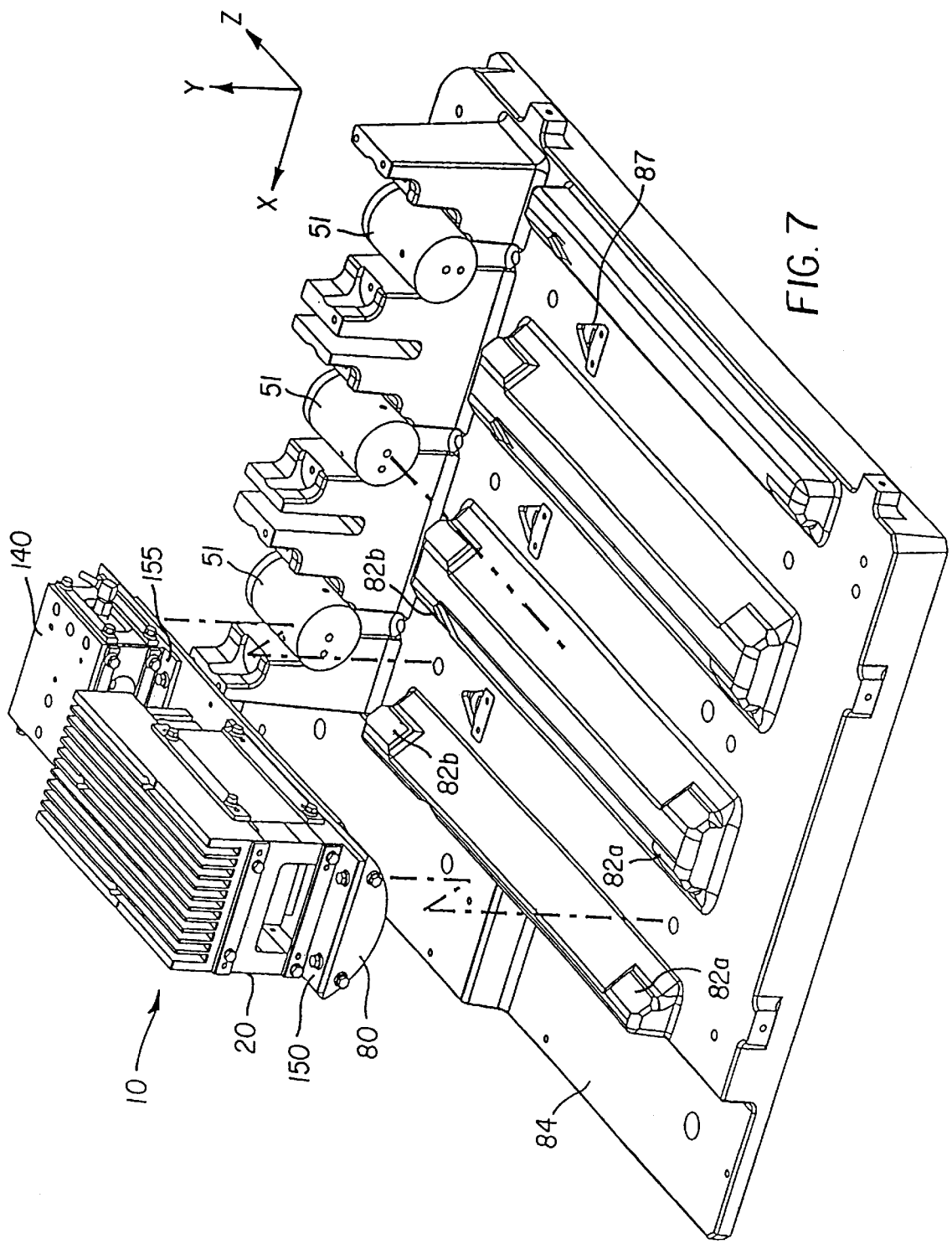
FIG. 7 shows a replaceable unit relative to a laser and optics casting.

Referring now to FIG. 6, the specifics of base 80 will now be described. Base 80 includes at least end cylindrical round surfaces 80a, 80b and an intermediate surface 83. End cylindrical surfaces 80a, 80b are adapted to mate with V-shaped supports or receiving surfaces 82a, 82b of casting 84 when optically aligned and assembled replaceable unit 10 is mounted on the casting 84 as shown in FIG. 7. A center of end surfaces 80a, 80b is designed to be along and substantially parallel to the center of the beam or the optical axis of lens 50 in order to reduce the sensitivity to $\theta_z$ angular errors. Since the beam diffracted out of AOM assembly 40 is relatively insensitive to focal or Z errors and $\theta_z$ angular errors, the beam will need to be located with only four degrees of freedom. These four degrees of freedom can be thought of as X and Y position, and $\theta_x$ and $\theta_y$.

Figure 8:
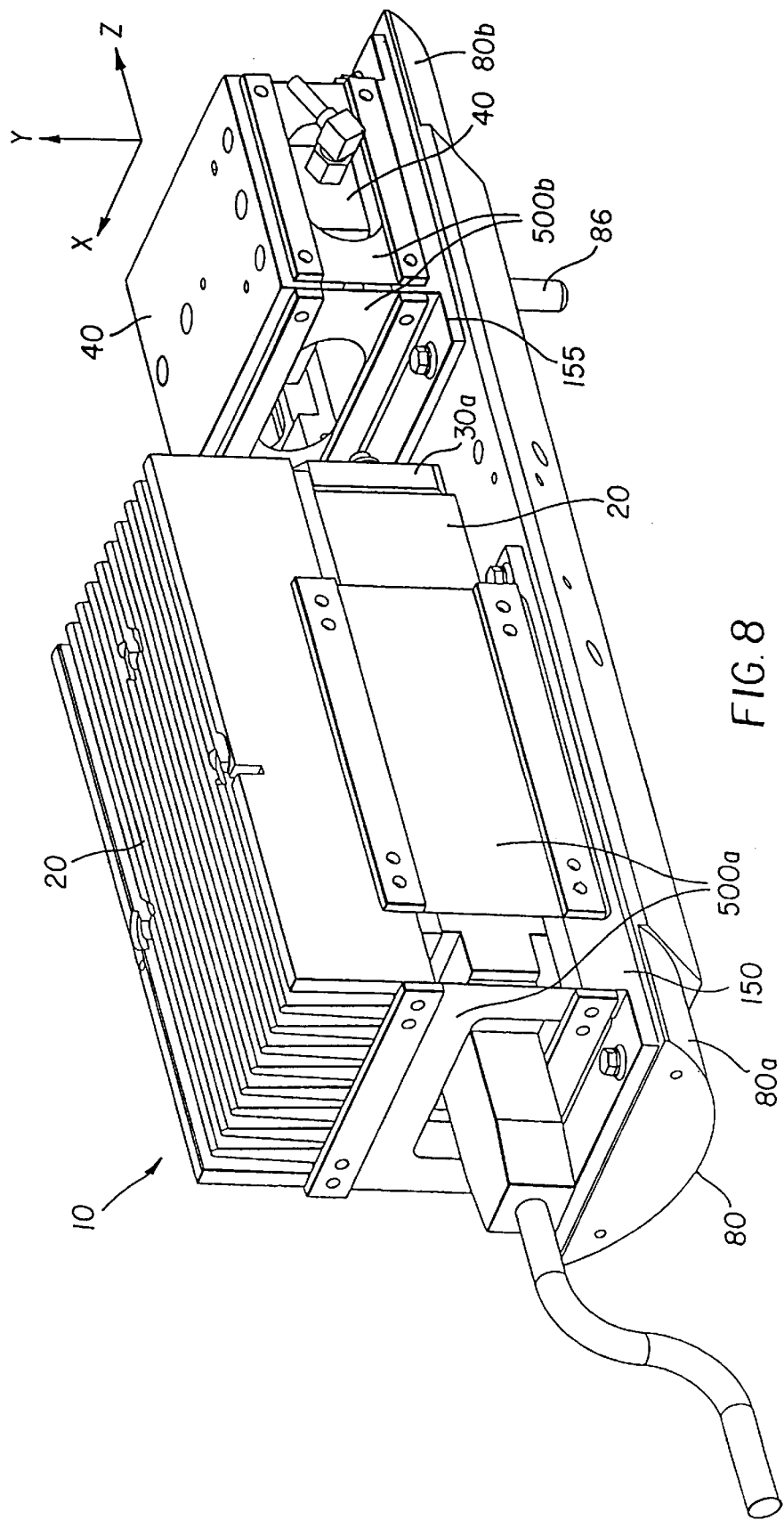
FIG. 8 is a detailed view of the replaceable unit in accordance with the present invention.

A feature of replaceable unit 10 is to achieve a precise, repeatable laser beam location with respect to the interface features of replaceable unit 10 in order to present input beams to fiber 60 which are substantially identical. For this purpose, as described above, replaceable unit 10 contains cylindrical base 80 (FIG. 6). Further, cylindrical end surfaces 80a, 80b can be precisely mounted in V-shaped receiving surfaces 82a, 82b of casting 84 as described above and shown in FIG. 7. This configuration permits replaceable units 10 to be positioned within a printer assembly in an exactly repeatable manner. For example, if replaceable unit 10 were removed from the printer assembly and replaced, it would go back into exactly the same position so that the critical alignment of the optical components would be maintained exactly. In a further feature of base 80 of the present invention, as illustrated in FIG. 8, base 80 includes a pin 86 which is fitable into a corresponding groove or opening 87 (FIG. 7) of casting 84. FIG. 8 shows an assembled replaceable unit 10 which includes laser assembly 20, lens 30 mounted within a lens mount 30a and attached to laser assembly 20, and AOM assembly 40, all fastened to base 80 by way of flexures 500a, 500b. This further permits the positioning of replaceable unit 10 to be exactly repeatable with respect to casting 84.

The assembly of replaceable unit 10 will take into account all the errors affecting the above noted four degrees of freedom. As explained above, the angles of the beam diffracted out of AOM assembly 40 are affected by the AOM crystal 43 orientation and the entering laser beam orientation. The X and Y beam heights of the AOM diffracted beam are largely determined by the entering laser beam X and Y heights.

The first step in assembly is the location of lens 30 (the $L_1$ lens). For the highly collimated green and blue lasers, lens 30 needs to be positioned in X and Y, otherwise the beam exiting lens 30 will have angular pointing errors. The Z position of the green and blue lenses 30 can be set without adjustment. The solid state red laser is diverging so its lens 30 is much stronger and in addition to X and Y position adjustments, it needs a Z adjustment to set the size of the AOM waist which is sensitive to its Z position. All three lasers and lenses 30 are adjusted as an assembly along Z to ensure that the lens 30 waist is located at the center of AOM assembly 40.

Figure 9:
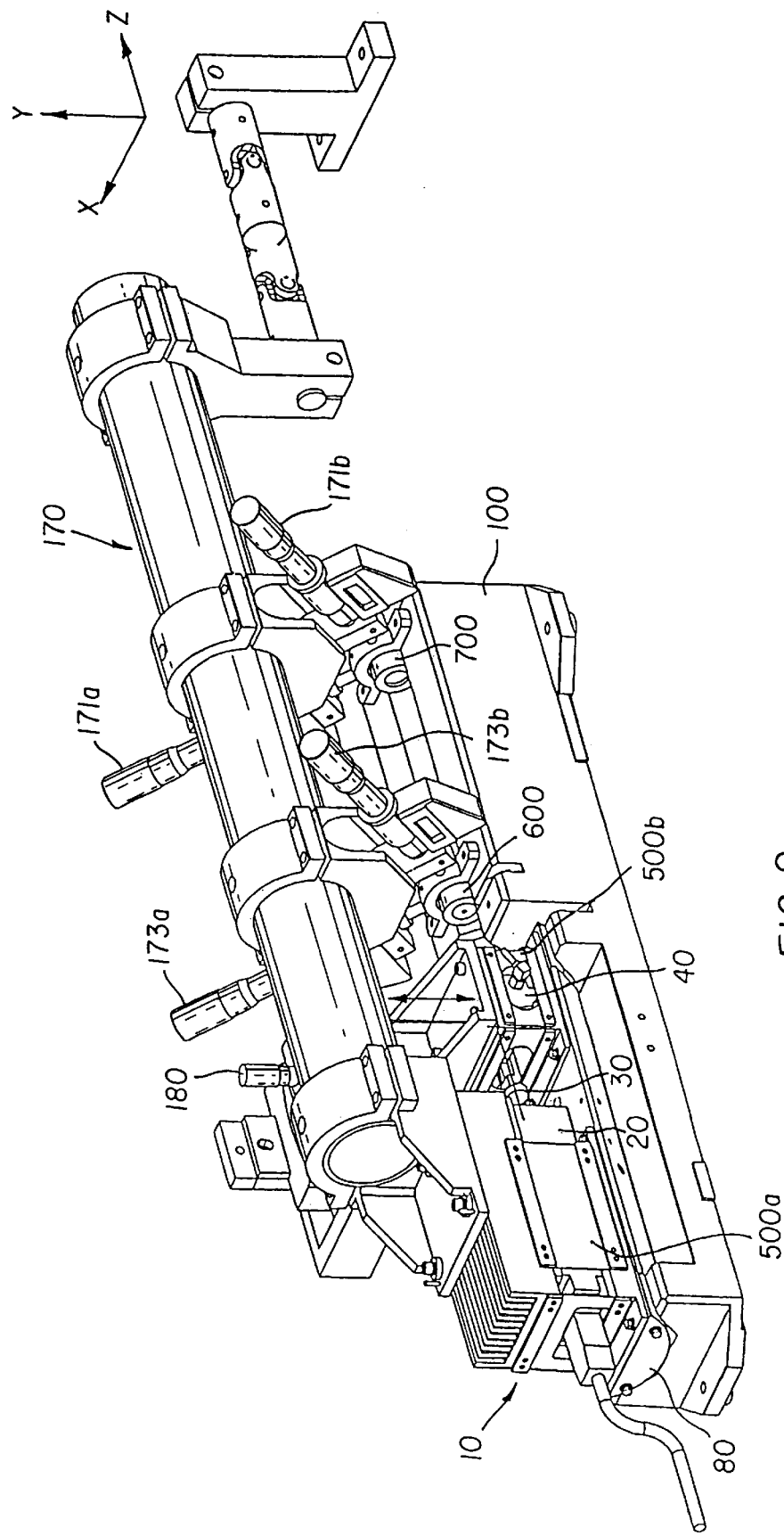
FIG. 9 illustrates alignment fixtures for the replaceable unit.

As illustrated in FIG. 9, for alignment purposes prior to mounting replaceable unit 10 on a printer, replaceable unit 10 is mounted to a first or lower alignment fixture 100. In a manner which will be described later, AOM assembly 40 is adjusted in height Y so that the acoustic column intercepts the lens 30 waist. AOM assembly 40 then is rotated in an $\theta_y$ angle for the Bragg condition to obtain the maximum diffraction efficiency or optical power diffracted into the first diffraction order. The diffracted beam is then located with respect to a reference for the optical axis of lens 50 by adjusting the whole assembly of laser assembly 20, lens 30 and AOM assembly 40 for the four degrees of freedom X, Y, $\theta_x$, $\theta_y$.

When the AOM diffracted beam has been adjusted to be substantially down the optical axis of lens 50, both laser assembly 20 and AOM assembly 40 are attached to the field replaceable mounting base 80 with flexures. Both the laser assembly and AOM assembly have flexures 500a, 500b to constrain their degrees of freedom as shown in FIGS. 8 and 9. Each replaceable unit 10 is then mounted in casting 84 (FIG. 7) of the laser printer for further alignment of the system starting with the fiber-optic coupler.

It is an advantage if the replaceable unit 10 is part of a system in which lens 50 images the AOM waist so that the image waist is geometrically conjugate to the AOM waist. The reason for this is that when the AOM temperature or RF driving voltages changes, the diffracted beam angles change by small amounts. If the AOM waist is geometrically conjugate to the single mode fiber face of the multiplexer input, then these angular changes in the diffracted beam do not cause the waist at the fiber face to change position. The only change is the beam pointing into the fiber and the optical power coupled into the fiber is relatively insensitive to angular errors as explained above. If the two waists are not geometrically conjugate, then displacement errors can occur leading to a reduction in optical power coupled into the fiber and thus an optical power variation into the laser printer dependent on temperature and AOM RF modulating voltage.

Figure 10:
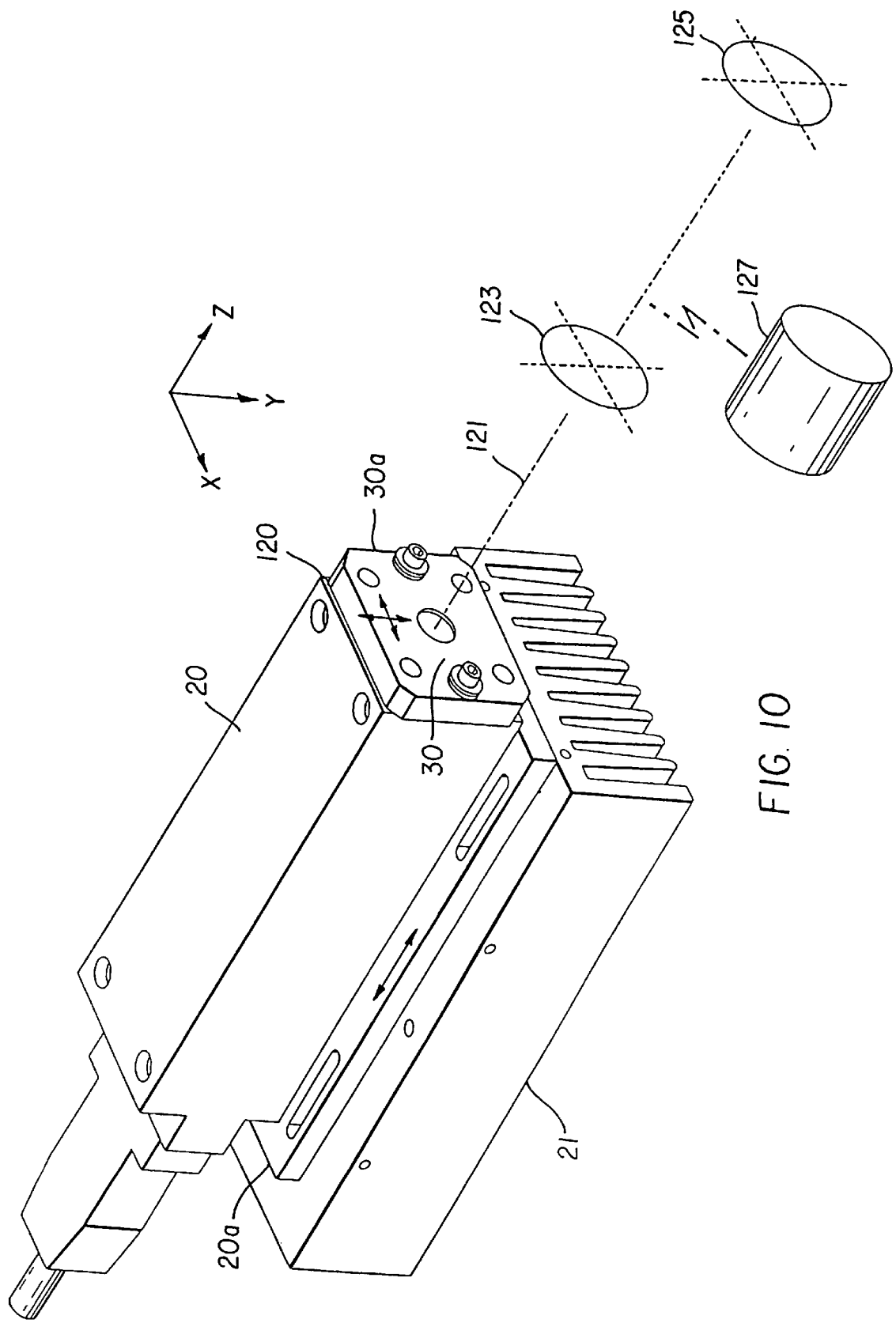
FIG. 10 illustrates an adjustment feature in assembling the replaceable unit.

An alignment and assembly procedure for the components of replaceable unit 10 will now be explained in detail. Laser beam pointing and beam waist adjustment of laser assembly 20 are the first alignment steps. This is done so that beam size and position at AOM assembly 40 are identical for all sub-assemblies built (see FIG. 10). Lens 30 is held in mount 30a, which is slideable against a laser mounting face 120 in the X and Y directions. Once beam 121 from lens 30 is visually centered at both front and back visual centering targets 123, 125, lens mount 30a is fastened in place. A beam profiler 127 which measures spot size is then inserted in the optical path (downstream of laser assembly 20 along beam 121) for determining beam waist location. As shown in FIG. 10, laser assembly 20 can include a laser base 20a. Laser assembly 20 and laser base 20a are adjusted in the Z direction as a pair with respect to a heatsink 21, in order to obtain the beam waist at profiler 127. Profiler 127 is fixed in a longitudinal position that corresponds with a center of AOM crystal 43. Once the beam waist is achieved, laser assembly 20 and laser base 20a are fastened to heatsink 21.

Figure 11:
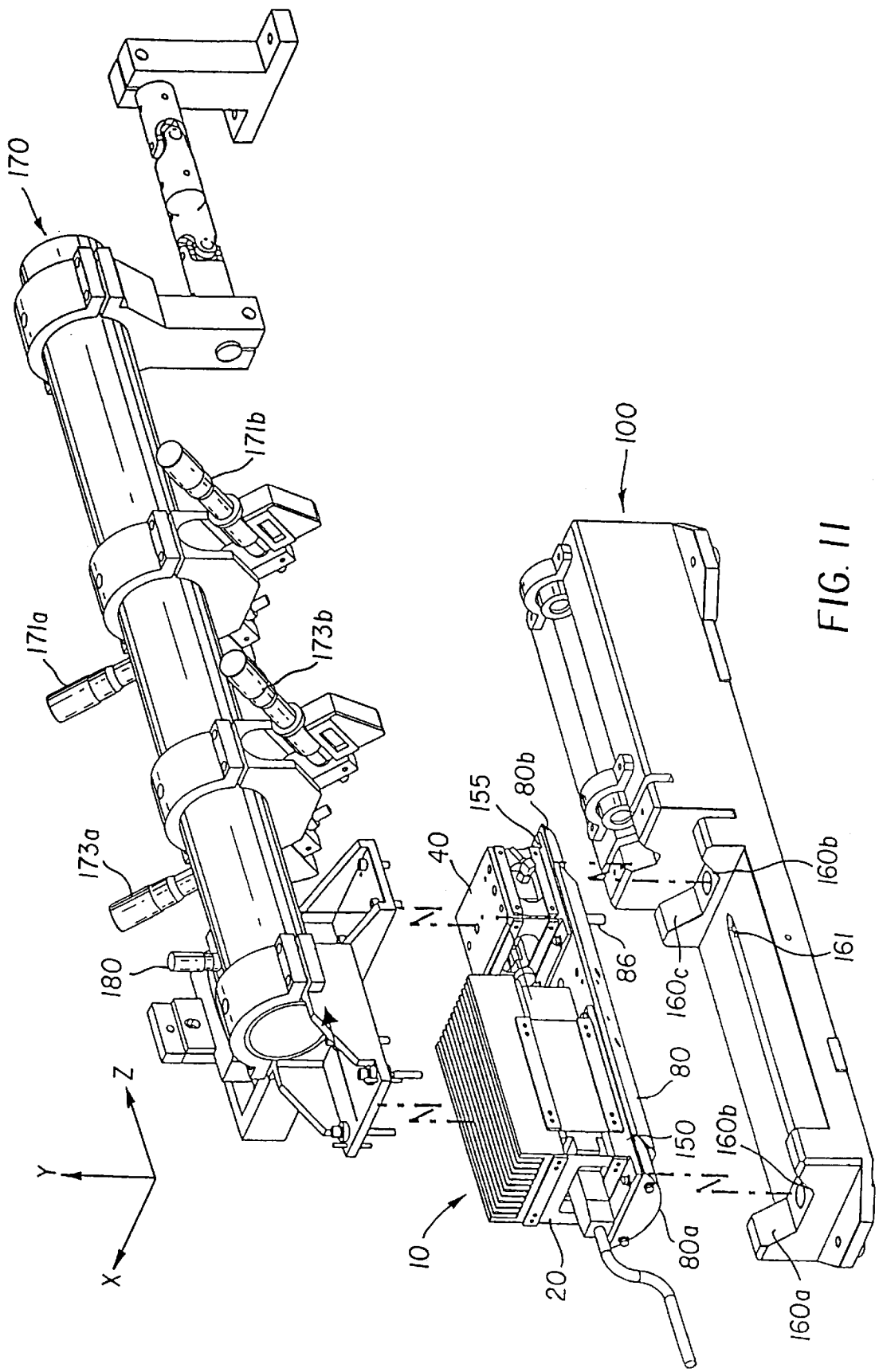
FIG. 11 is an exploded view of the replaceable unit and alignment fixtures.
Figure 12:
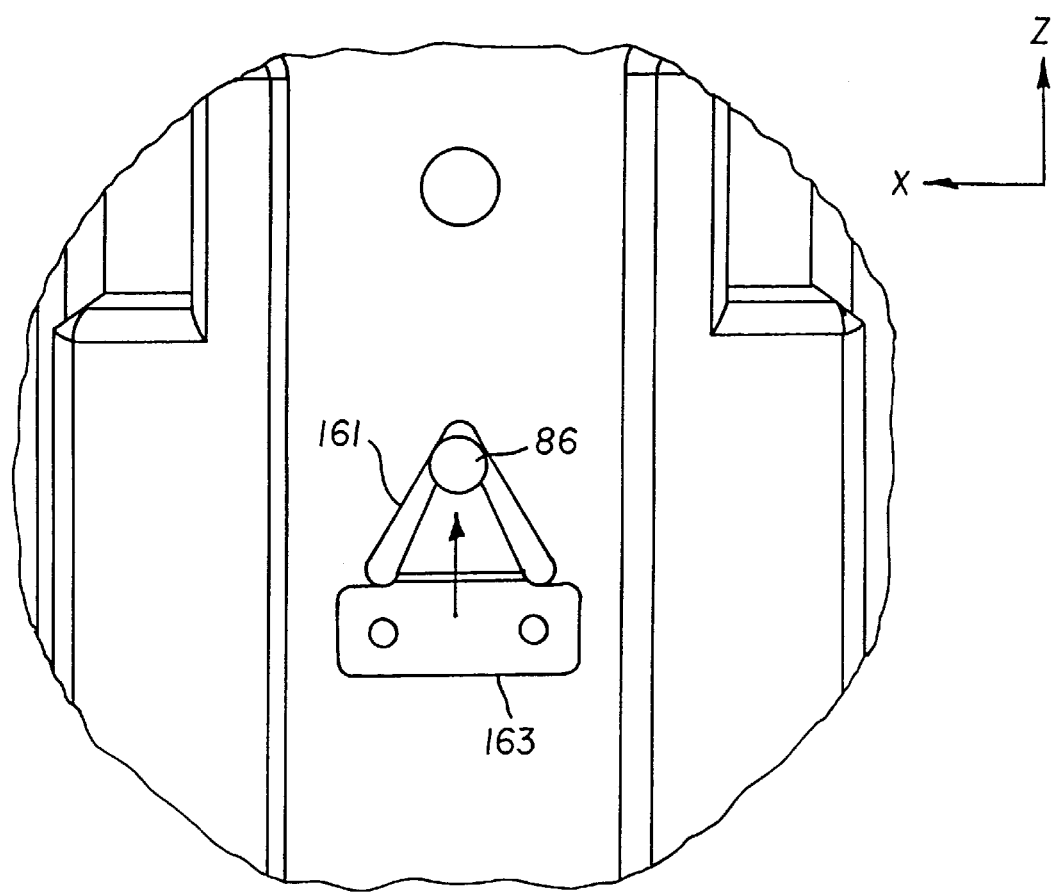
FIG. 12 is a detailed view of a locating pin on the base of the replaceable unit.

Laser assembly 20 and AOM assembly 40 are then loosely fastened through a plurality of flexures 500a, 500b, to replaceable unit mounting base 80 as shown in FIG. 8 and FIG. 11, through a laser pivot plate 150 and an AOM pivot plate 155 respectively. Both pivot plates 150, 155 are loosely fastened to replaceable unit mounting base 80. The preassembled unit is then mounted to first or lower alignment fixture 100, as shown in FIGS. 9. As illustrated in FIG. 11, cylindrical surfaces 80a, 80b (front and rear) on replaceable unit mounting base 80 are located against four mounting pads 160a–160d in lower fixture 100. Fixture 100 simulates casting 84 illustrated in FIG. 7. Locating pin 86 attached to replaceable unit mounting base 80 is held against a vee-groove 161 through a spring loaded flexure 163(see FIG. 12). The combination of these features insures that all replaceable unit mounting bases 80 are identically located. Although flexures 500a, 500b are shown for loosely fastening laser assembly 20 and AOM assembly 40, it is noted the other fastening means such as glue or a loosely fastened hinged plate can be utilized.

Figure 13:
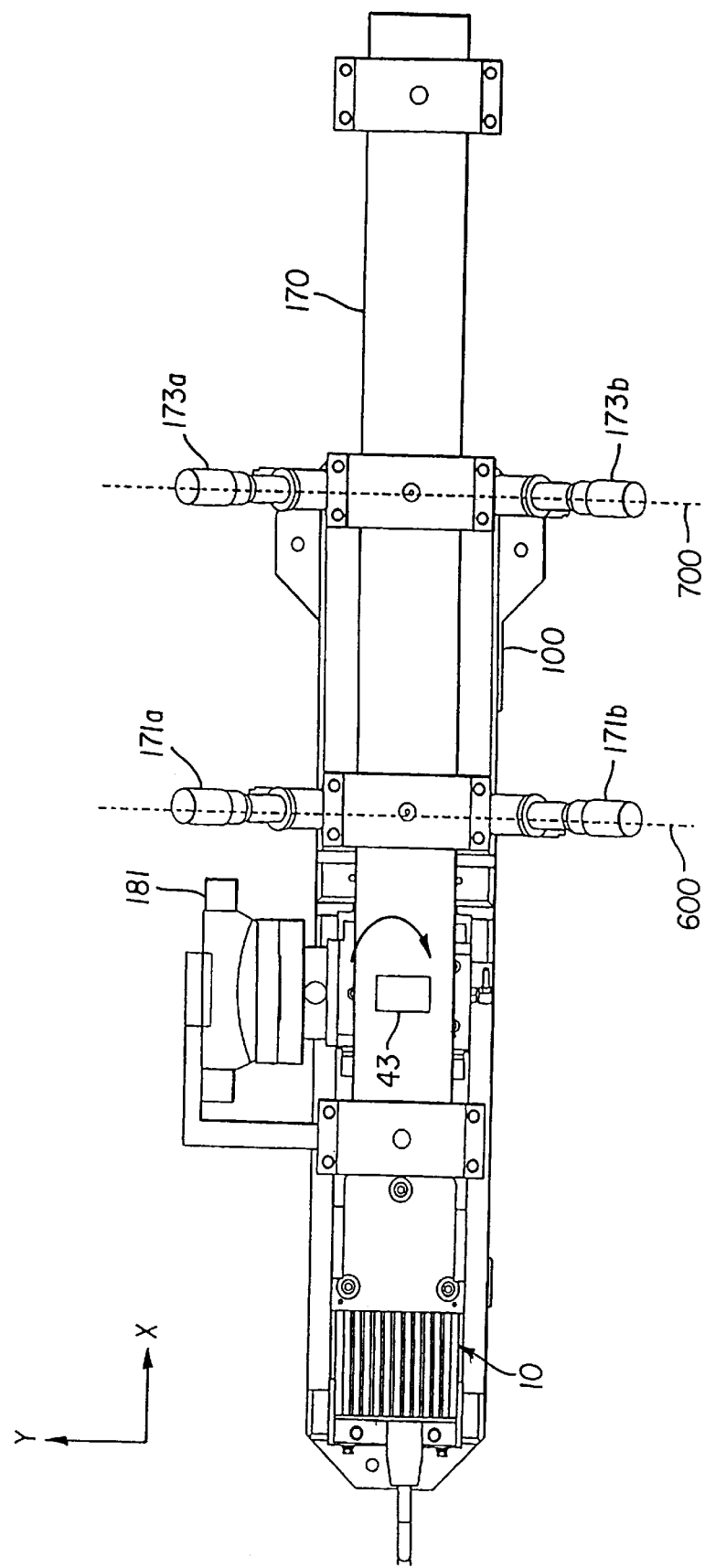
FIG. 13 is a top view of the alignment fixture.

As shown in FIGS. 9 and 11, an upper alignment fixture 170 is fastened to both laser assembly 20 and AOM assembly 40. Upper fixture 170 has two adjustors 180, 181 for independently moving AOM assembly 40 in the Y and $\theta_y$ directions. Adjuster 181 can be seen in FIG. 13. These respectively noted adjustments are required to achieve maximum diffraction efficiency of the diffracted beam. Fixture 170 further comprises beam pointing adjusters 171a, 171b, 173a and 173b for respectively dependently moving both laser assembly 20 and AOM assembly 40 in the X, Y, $\theta_x$, and $\theta_y$ directions. These adjustments are required to center the diffracted beam at centrally or center line target positions in the form of two quadrant detector positions 600, 700. The quadrant detector positions 600,700 are coplanar with beam pointing adjustors 171a, 171b, and 173a, 173b as shown in FIGS. 9 and 13, in order to reduce the alignment iterations required to position the diffracted beam at both detector positions.

Figure 14:
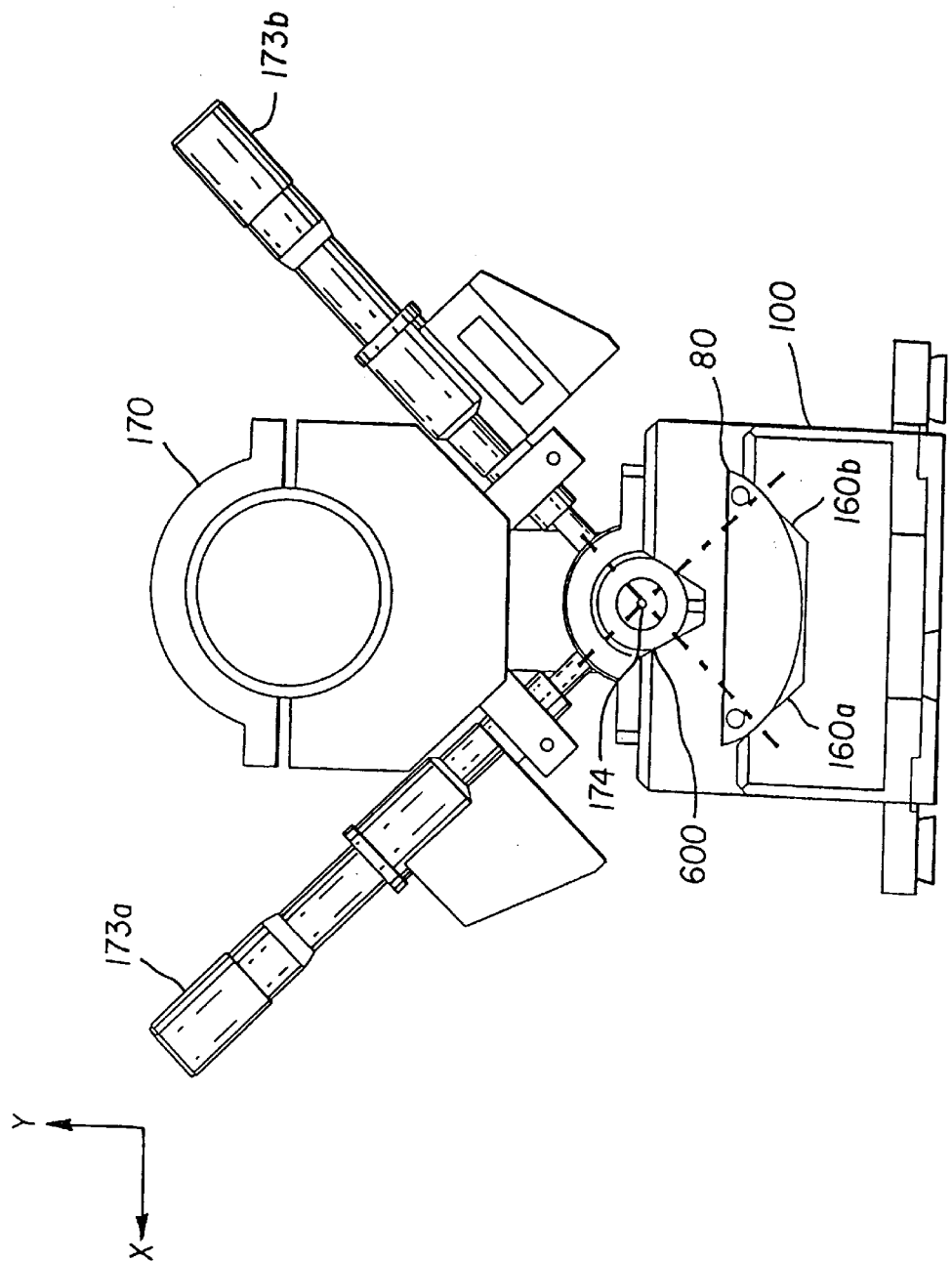
FIG. 14 is an end view of the alignment fixture.

Use of the quadrant detector positions 600, 700 makes it possible to accurately position a laser beam within submicrons. This high resolution is required to insure that the diffracted beam on all replaceable units are identically aligned and centered. Beam pointing adjustors 171a, 171b and 173a, 173b, intersect at the quadrant detector center as shown in FIG. 13; this is also done to reduce the alignment iterations required. As also shown in FIG. 14, cylindrical surfaces 80a, 80b, 83 on replaceable unit mounting base 80 are designed such that the radius of curvature of these surface intersects at diffracted beam centerline 174. This is common design practice in mounting of optical components, and also eliminates any asymmetrical movement of the diffracted beam (in the X direction), due to thermal changes in FRU 10.

After maximum AOM diffraction efficiency is achieved, and the diffracted beam position is aligned at both detector locations 600, 700, the laser and AOM pivot plates 150, 155 are securely fastened to replaceable unit mounting base 80. Pivot plates 150, 155 allow motion in the $\theta_y$ direction, which minimizes distortion of flexures 500a, 500b in that degree-of-freedom. Without this additional degree-of-freedom during alignment, fastening flexures 500a, 500b down in a distorted condition can cause residual stresses, which could affect beam positioning accuracy. Once pivot plates 150, 155 are locked, the plurality of laser and AOM flexures 500a, 500b are securely fastened, so that rigid body connections are made between laser and AOM assemblies 20, 40 to replaceable unit mounting base 80. Once this is completed, replaceable unit 10 having its optically aligned components can be removed from fixtures 100 and 170 and placed in laser and optics casting 84. Casting 84 has identical locating pad features (4) for contact against the cylindrical surfaces of replaceable unit mounting base 80; in addition to identical features for the locating pin mount 86. This insures exact placement of each replaceable unit in every casting.

Figure 15:
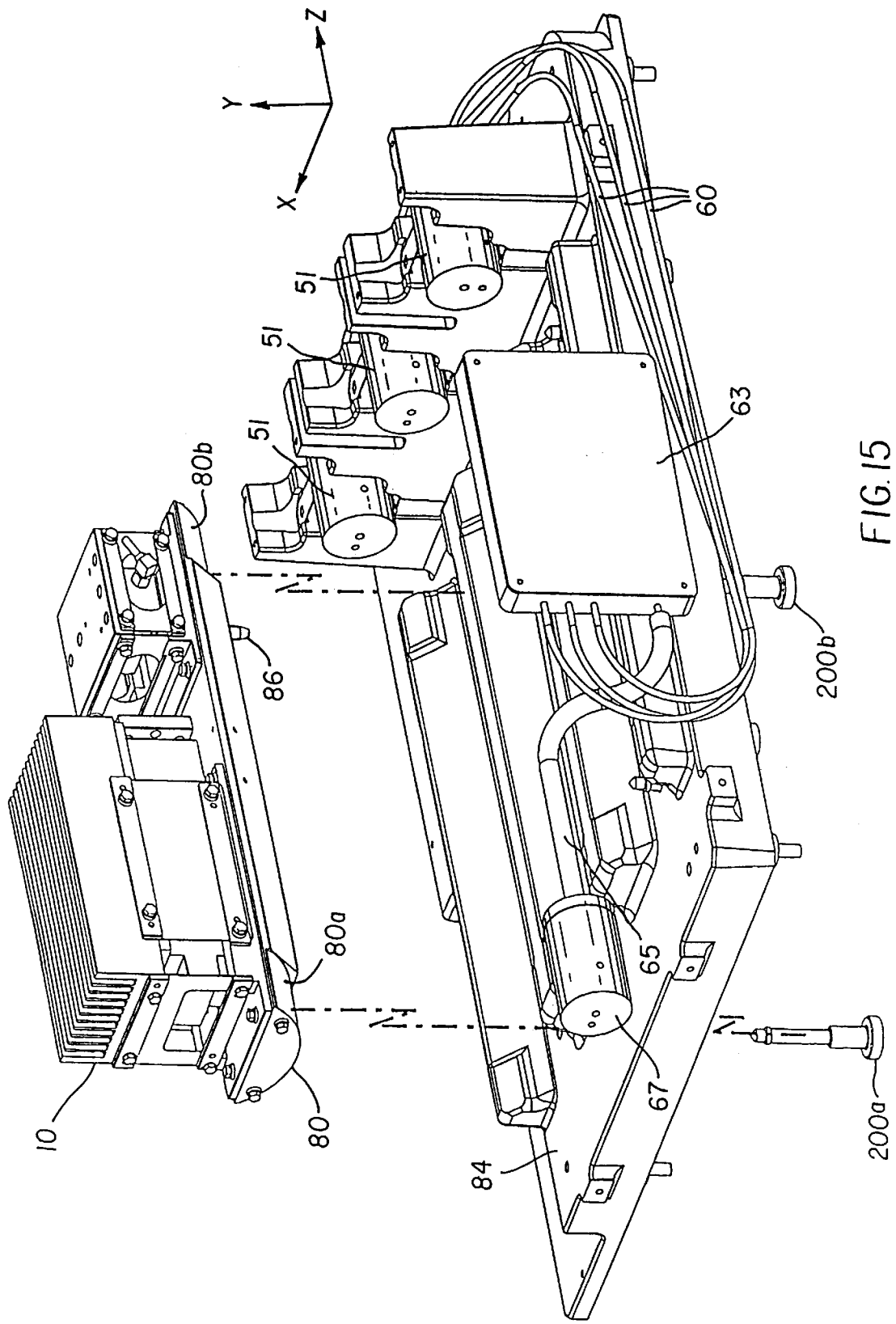
FIG. 15 is an exploded view of the replaceable unit and the receiving structure.

Replaceable unit 10 can be fastened in place, for example, with thumb screws 200a, 200b affixed to casting 84 as shown in FIG. 15. This facilitates ease in replacement of replaceable unit 10. With the initial replaceable unit (in each of three color channels) located on casting 84, the fiber-optic coupler(s) 51 are aligned with respect to the diffracted beam entering the coupler assemblies. Should a laser or AOM fail, replaceable unit 10 can easily be replaced with one of an identical color. Since all replaceable units are aligned with the same fixture and quadrant detector, and since all locating features between the fixture and casting are identical; field replacement is assured while maintaining maximum optical power coupled into the fiber. Although the present invention has been described with reference to targeting a light beam onto a fiber face, it is recognized that the light beam could be targeted onto various optical elements of a printer, such as a lens, a beam combiner, etc.

The invention has been described in detail with particular reference to certain preferred embodiments thereof, but it will be understood that variations and modifications can be effected within the spirit and scope of the invention.

What is claimed is:

1. A method of assembling a replaceable light source and modulator unit, the method comprising the steps of:

mounting the light source on a base so as to be movable with respect to said base;

mounting a lens adjacent to said light source so as to be movable with respect to said light source;

adjusting said lens in at least a transverse position with respect to a light beam from said light source so that said light beam is visually centered at a visual target position;

placing a beam profiler in an optical path downstream of said lens to obtain a light beam waist position;

adjusting said light source in a direction of said light beam to obtain said beam waist at said beam profiler;

wherein said step of placing said beam profiler in said optical path comprises the step of locating said beam profiler at a position which corresponds with a center of a crystal of a modulator assembly;

replacing said beam profiler with said modulator assembly such that said modulator assembly is mounted in a movable manner on said base;

positioning said base having said light source and said modulator assembly movably mounted thereon on a first fixture, said first fixture simulating a receiving structure of a printer;

removably fastening a second fixture on said light source and said modulator assembly, said second fixture having at least two modulator adjuster for moving the modulator assembly in linear and rotational directions and at least one light source adjuster for moving said light source in linear and rotational directions with respect to the light beam incident upon the modulator assembly;

adjusting said second fixture by holding both the light source and modulator assembly in four degrees of freedom wherein a beam exiting the modulator assembly is aligned with respect to said first fixture; and rigidly fastening both the light source and modulator assembly to said base making a complete field replaceably unit.

2. The method according to claim 1, comprising the further steps of:

fastening said light source and said modulator assembly onto said base;

removing said base from said first fixture;

removing said second fixture from said light source and said modulator assembly; and placing said base having said light source and said modulator assembly fastened thereon onto said receiving structure of said printer assembly.

3. The method according to claim 1, wherein said base comprises at least one cylindrical surface and a locating pin which respectively cooperate with at least one mounting location and a groove on said first fixture when said base is positioned on said first fixture.

4. The method according to claim 1, wherein said modulator adjuster comprises opposing beam pointing assemblies which position laser beams so as to intersect along a center line of said diffracted beam.

5. The method according to claim 1, wherein said lens is movably mounted to an end face of said light source.

6. The method according to claim 1, wherein said light source is a laser.

7. The method according to claim 1, wherein said modulator is an acousto-optical modulator.

8. A method of assembling a replaceable light source and modulator unit, the method comprising the steps of:

mounting the light source on a base so as to be movable with respect to said base;

mounting a lens adjacent to said light source so as to be movable with respect to said light source;

adjusting said lens in at least a transverse position with respect to a light beam from said light source so that said light beam is visually centered at a visual target position;

placing a beam profiler in an optical path downstream of said lens to obtain a light beam waist position;

adjusting said light source in a direction of said light beam to obtain said beam waist at said beam profiler;

wherein said step of placing said beam profiler in said optical path comprises the step of locating said beam profiler at a position which corresponds with a center of a crystal of a modulator assembly;

replacing said beam profiler with the modulator assembly such that said modulator assembly is mounted in a movable manner on said base;

positioning said mount having said light source and said modulator assembly movably mounted thereon on a fixture, wherein said fixture simulates a receiving structure of a printer;

adjusting a position of said modulator assembly along a vertical axis and in a rotational direction about said vertical axis so as to provide for maximum diffraction efficiency of a diffracted beam from said modulator assembly; and adjusting a position of both said modulator assembly and said light source along said vertical axis, along an axis transverse to said vertical axis and in rotational directions about said vertical axis and said axis transverse to said vertical axis so as to center said diffracted beam at a central alignment target position of said first fixture.

9. The method according to claim 8, comprising the further steps of:

fastening said light source and said modulator assembly onto said base;

removing said base from said fixture;

placing said base having said light source and said modulator assembly fastened thereon onto said receiving structure of said printer.

10. The method according to claim 8, wherein said base comprises at least one cylindrical surface and a locating pin which respectively cooperate with at least one mounting location and a groove on said fixture when said base is positioned on said fixture.

11. A method of assembling a replaceable light source and modulator unit, the method comprising the steps of:

mounting the light source on a base so as to be movable with respect to said base;

mounting a lens adjacent to said light source so as to be movable with respect to said light source;

adjusting said lens in at least a transverse position with respect to a light beam from said light source so that said light beam is visually centered at a visual target position;

placing a beam profiler in an optical path downstream of said lens to obtain a light beam waist position;

adjusting said light source in a direction of said light beam to obtain said beam waist at said beam profiler;

wherein said step of placing said beam profiler in said optical path comprises the step of locating said beam profiler at a position which corresponds with a center of a crystal of a modulator assembly;

replacing said beam profiler with the modulator assembly such that said modulator assembly is mounted in a movable manner on said base; and wherein said light source and said modulator assembly are movably mounted to said base by way of flexures.

* * * * *